(12) United States Patent
Jung

(10) Patent No.: US 7,867,901 B2
(45) Date of Patent: Jan. 11, 2011

(54) METHOD FOR FORMING SILICIDE IN SEMICONDUCTOR DEVICE

(75) Inventor: Kyoung-Hwa Jung, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 15 days.

(21) Appl. No.: 12/495,887

(22) Filed: Jul. 1, 2009

(65) Prior Publication Data
US 2010/0003793 A1    Jan. 7, 2010

(30) Foreign Application Priority Data
Jul. 1, 2008    (KR) ............... 10-2008-0063406

(51) Int. Cl.
H01L 21/44 (2006.01)

(52) U.S. Cl. ............... 438/656; 438/683; 438/755; 257/E21.165

(58) Field of Classification Search ............... 438/656, 438/683, 755; 257/E21.165
See application file for complete search history.

(56) References Cited

U.S. PATENT DOCUMENTS

| | | | |
|---|---|---|---|
| 2007/0170501 A1* | 7/2007 | Lee et al. | 257/344 |
| 2007/0254480 A1* | 11/2007 | Matsuda et al. | 438/682 |
| 2009/0004853 A1* | 1/2009 | Bu et al. | 438/664 |

* cited by examiner

Primary Examiner—Trung Dang
(74) Attorney, Agent, or Firm—Sherr & Vaughn, PLLC

(57) ABSTRACT

A method for forming silicide in a semiconductor device includes simultaneously performing a cleaning process and an etching process to remove a silicide metal layer if an excessive delay in time lapses after forming the silicide metal layer. This may prevent the occurrence of liquid marks due to an oxidation reaction at an interface of the semiconductor substrate in contact with the silicide metal layer, thereby preventing silicide defects due to the excessive delay.

20 Claims, 5 Drawing Sheets

US 7,867,901 B2

METHOD FOR FORMING SILICIDE IN SEMICONDUCTOR DEVICE

The present application claims priority under 35 U.S.C. §119 to Korean Patent Application No. 10-2008-0063406, filed on Jul. 8, 2009, which is hereby incorporated by reference in its entirety.

BACKGROUND

Silicides have been actively used in semiconductor device processes because of exhibiting low resistance, high thermal stability and easy adaptation to current silicon processes. Moreover, silicide layers formed on and/or over surfaces of a gate electrode and a source/drain junction may advantageously reduce a specific resistance of the gate electrode and a source/drain contact resistance respectively.

In particular, logic devices, which must realize a high speed operation, may have a serious problem in performance due to an increase in gate resistance and contact resistance. Although an attempt may be made to reduce a contact size from a structural viewpoint, this does not assure a desired contact resistance value and causes a delay at interconnections, thus making it impossible for the entire device to realize a high speed operation. Therefore, a silicide process to reduce a contact resistance is adopted. In a self-aligned silicide (salicide) process, silicide layers are formed simultaneously on and/or over surfaces of both a gate electrode and a source/drain junction due to a spacer present on and/or over a sidewall of the gate electrode.

Figure 1A:
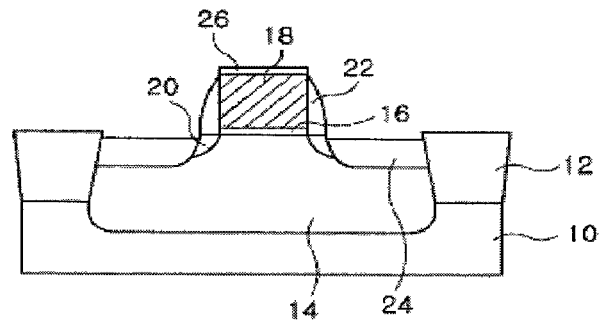

As illustrated in FIG. 1A, a method for forming silicide in a semiconductor device can include forming gate dielectric layer 16 and gate electrode 18 on and/or over semiconductor substrate 10, such as a silicon substrate in which device isolation layer 12, well 14, etc. are formed. Lightly doped drain (LDD) region 20 is formed in substrate 10 between an edge of gate electrode 18 and device isolation layer 12. Spacer 22 is formed on and/or over a sidewall of gate electrode 18. Source/drain region 24 is formed in substrate 10 between an edge of spacer 22 and device isolation layer 12. Native oxide layer 26 may be formed on and/or over an upper surface of gate electrode 18. Similarly, a native oxide layer may be formed on and/or over an uppermost surface of source/drain region 24.

Figure 1B:
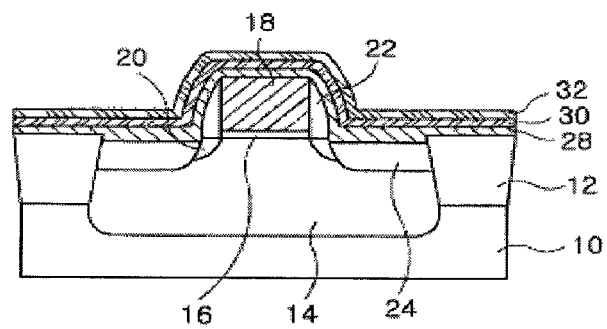

As illustrated in FIG. 1B, native oxide layer 26 and other impurities, which may be formed on and/or over the uppermost surfaces of gate electrode 18 and source/drain region 24, are removed via a pre-cleaning process. Thereafter, silicide metal layer 28 is formed on and/or over the entire surface of semiconductor substrate 10 by depositing a metal layer such as, e.g., a cobalt (Co) layer. Since cobalt (Co) used in the silicide metal layer 28 is easily oxidized upon exposure to air, capping layers 30, 32 may be formed on and/or over silicide metal layer 28 by sequentially depositing a metal layer such as, e.g., titanium (Ti) layer and/or titanium nitride (TiN) layer.

Figure 1C:
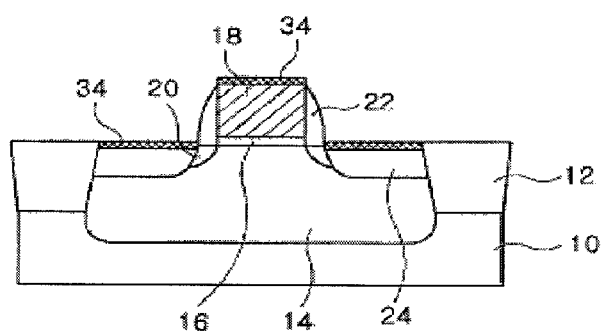

As illustrated in FIG. 1C, a primary annealing process is carried out to react silicon (Si) of semiconductor substrate 10 with cobalt (Co) of silicide metal layer 28, thus forming silicide layers 34 of cobalt monosilicide (CoSi) on and/or over the uppermost surfaces of both gate electrode 18 and source/drain region 24, respectively. Subsequently, semiconductor substrate 10, on and/or over which silicide layers 34 are formed, is subjected to a cleaning process using a cleaning solution such as, e.g., a sulfuric acid solution, to remove silicide metal layer 28 and capping layers 30, 32 which remain not having reacted during the primary annealing process, i.e., cobalt (Co)/titanium (Ti)/titanium nitride (TiN) residues on and/or over substrate 10. Thereafter, a secondary annealing process is carried out to convert cobalt monosilicide (CoSi) of silicide layers 34 into cobalt disilicide ($CoSi_2$), which has a lower surface resistance.

With the above-described silicide forming method, it can be appreciated that capping layers 30, 32 are formed on and/or over silicide metal layer 28 in order to prevent silicide metal layer 28 from being exposed to air. However, if an excessive delay is encountered after forming silicide metal layer 28 and prior to carrying out the primary annealing process despite the above-described effort, an oxidation reaction may occur at an interface of semiconductor substrate 10 in contact with silicide metal layer 28. The growth of a native oxide layer due to the oxidation reaction causes liquid marks and deteriorates a reaction of silicon (Si) and cobalt (Co) during the following primary annealing process. This may result in silicide defects such as improper formation of silicide layers 34.

SUMMARY

Embodiments relate to a method for forming silicide in a semiconductor device such that if an excessive delay passes after forming a silicide metal layer and prior to carrying out an annealing process, the silicide metal layer is removed to thereby remove a native oxide layer formed on and/or over a surface of a semiconductor substrate and thereafter, a silicide forming process is repeatedly carried out. Thereby silicide defects due to the excessive delay may be prevented.

In accordance with embodiments, a method for forming silicide in a semiconductor device may include at least one of the following: forming a silicide metal layer on and/or over an uppermost surface of a semiconductor substrate in which a gate electrode, device isolation layer, and source/drain region are formed; and then removing the silicide metal layer using cleaning and etching chemicals if a predetermined time elapses after forming the silicide metal layer; and then removing a native oxide layer formed on and/or over an upper surface of the gate electrode by performing a pre-cleaning process on the semiconductor substrate, from which the silicide metal layer is removed; and then repeatedly forming a silicide metal layer on and/or over the uppermost surface of the semiconductor substrate from which the silicide metal layer and native oxide layer are removed; and then performing an annealing process on the semiconductor substrate on and/or over which the silicide metal layer is formed, thereby converting the silicide metal layer into a silicide layer.

In accordance with embodiments, a method for forming silicide in a semiconductor device may include at least one of the following: forming a first silicide metal layer over a semiconductor substrate in which a gate electrode, device isolation layer, and source/drain region are formed; and then removing the first silicide metal layer using cleaning and etching chemicals if a predetermined period of time lapses after forming the first silicide metal layer; and then removing a native oxide layer formed over an upper surface of the gate electrode by performing a pre-cleaning process on the semiconductor substrate after removing the first silicide metal layer; and then repeatedly forming a second silicide metal layer over the the semiconductor substrate after removing the native oxide layer; and then forming a silicide layer by performing an annealing process on the semiconductor substrate after forming the second silicide metal layer is repeatedly formed.

In accordance with embodiments, a method may include at least one of the following: forming a gate electrode, device isolation layer, and source/drain region over a semiconductor substrate; and then forming a first silicide metal layer over the uppermost surface of the gate electrode and the source/drain region are formed; and then simultaneously performing a first cleaning process and an etching process to remove the first silicide metal layer if a predetermined period of time lapses after forming the first silicide metal layer; and then performing second cleaning process on the semiconductor substrate after removing the first silicide metal layer to remove a native oxide layer formed over an uppermost surface of the gate electrode; and then repeatedly forming a second silicide metal layer over the semiconductor substrate after performing the second cleaning process; and then forming a silicide layer by performing an annealing process on the semiconductor substrate after repeatedly forming the second silicide metal layer.

In accordance with embodiments, forming device isolation layer in a semiconductor substrate to define an active area; and then forming a gate electrode in the active area; and then performing a low density ion implantation process using the gate electrode as an ion implantation mask to form a lightly doped drain region in the semiconductor substrate between the gate electrode and the device isolation layer; and then forming a spacer over a sidewall of the gate electrode after forming the lightly doped drain region; and then performing a high density ion implantation process using the spacer and the gate electrode as ion implantation masks to form a source/drain region in the semiconductor substrate between the spacer and the device isolation layer; and then performing a first cleaning process on the semiconductor substrate; and then forming a first silicide metal layer over the uppermost surface of the gate electrode and the source/drain region are formed; and then simultaneously performing a second cleaning process and an etching process to remove the first silicide metal layer if a predetermined period of time lapses after forming the first silicide metal layer; and then repeatedly forming a second silicide metal layer over the semiconductor substrate after simultaneously performing the second cleaning process and the etching process; and then forming a silicide layer by performing an annealing process on the semiconductor substrate after repeatedly forming the second silicide metal layer.

DRAWINGS

FIGS. 1A to 1C illustrate a method for forming silicide in a semiconductor device.

Figure 2A:
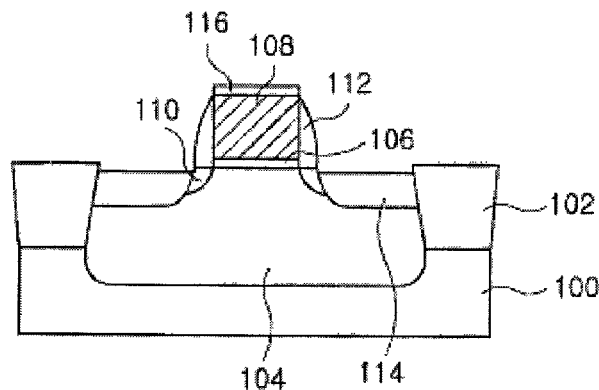
Figure 2B:
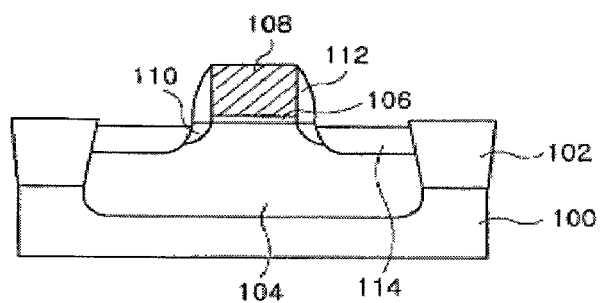
Figure 2C:
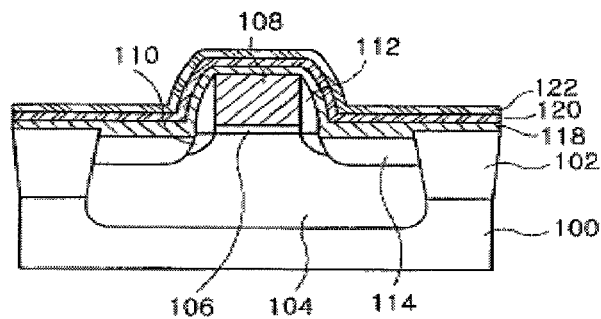
Figure 2D:
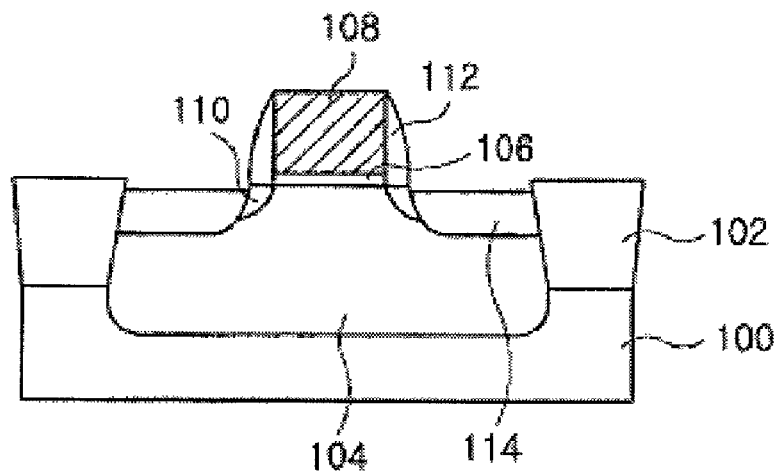
Figure 2E:
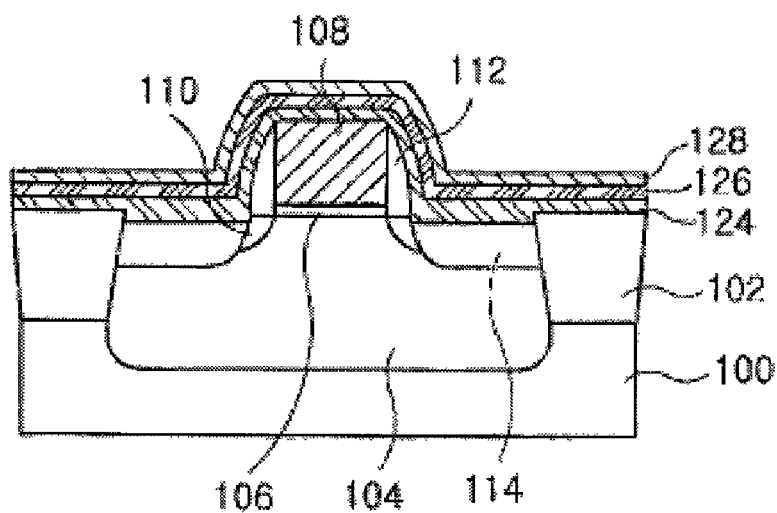
Figure 2F:
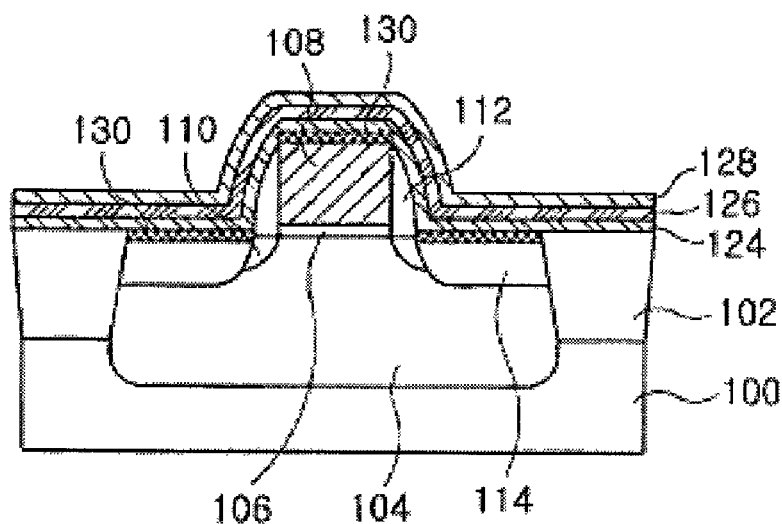
Figure 2G:
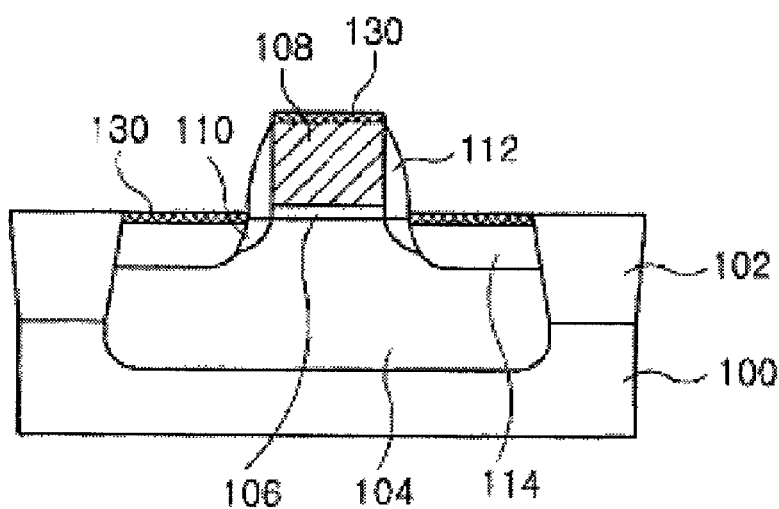
Figure 3:
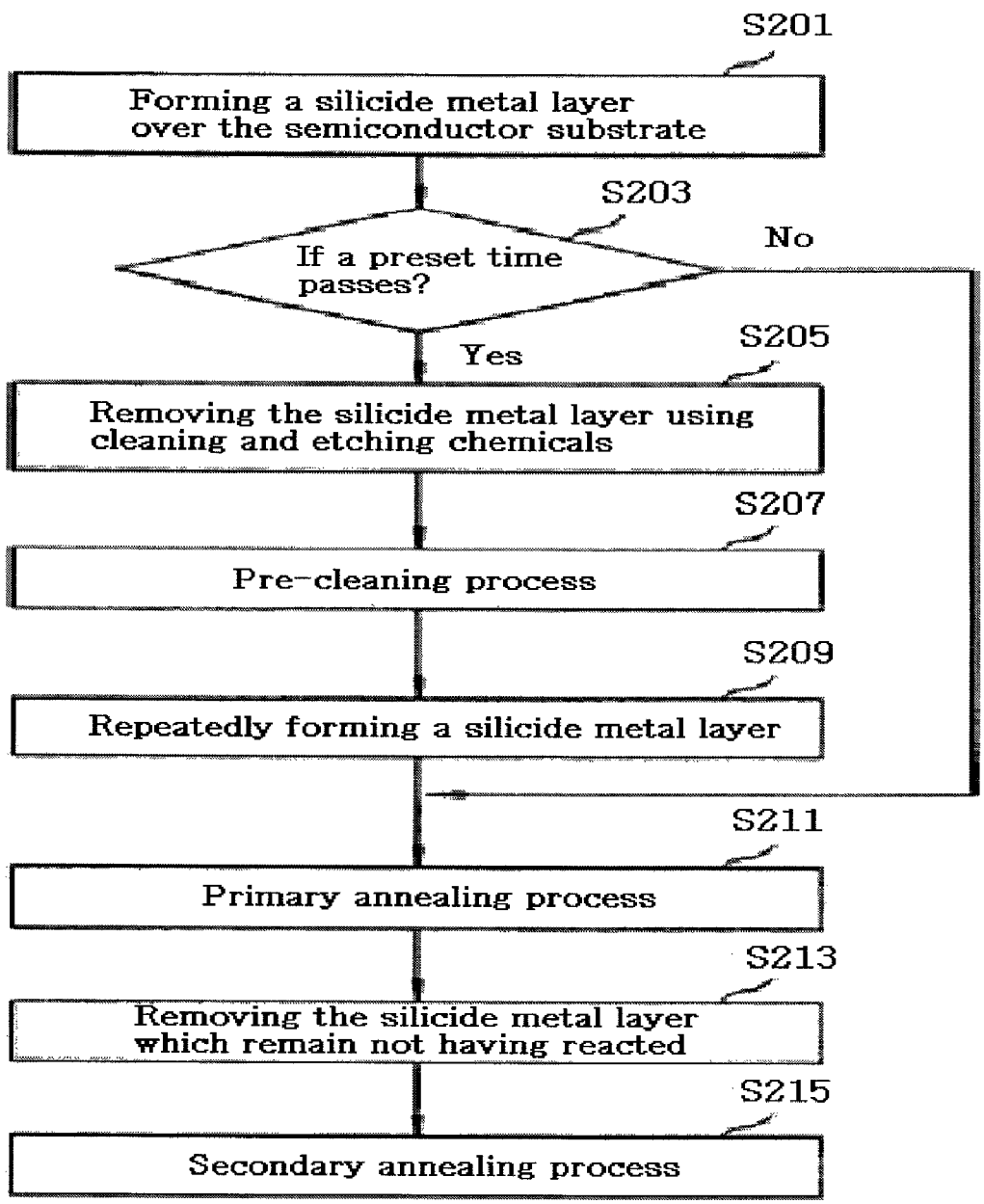

Example FIGS. 2 and 3 illustrate a method for forming silicide in a semiconductor device in accordance with embodiments.

DESCRIPTION

As illustrated in example FIG. 2A, device isolation layer 102 is formed in semiconductor substrate 100 such as, e.g. a silicon substrate, to define an active area and an inactive area. P-type dopants may be ion-implanted into the active area defined by device isolation layer 102, thus forming well 104. Dielectric layer composed of, e.g., silicon oxide ($SiO_2$) is then formed on and/or over the entire surface of semiconductor substrate 100 including device isolation layer 102 and well 104, and in turn, a gate conductive layer composed of, e.g., doped polysilicon, is formed on and/or over the dielectric layer. Gate electrode 108 is formed by patterning the gate conductive layer using a photoresist pattern that defines a gate region, and gate dielectric layer 106 is formed by patterning the underlying dielectric layer. A low density ion implantation process is then carried out using gate electrode 108 as an ion implantation mask. In such a case, ions of phosphorus (P) as n-type dopant may be ion-implanted at a predetermined low density, thus forming LDD region 110 in substrate 100 between an edge of gate electrode 108 and device isolation layer 102.

Spacer 112 is formed on and/or over a sidewall of gate electrode 108 by depositing a dielectric material, e.g., silicon nitride (SiN) or silicon oxy-nitride (SiON) on and/or over the entire surface of semiconductor substrate 100 and etching the deposited dielectric material. A high density ion implantation process is then carried out using spacer 112 and gate electrode 108 as ion implantation masks. Specifically, n-type dopant is ion-implanted at a predetermined high density, thus forming source/drain region 114 in substrate 100 between an edge of spacer 112 and device isolation layer 102. In this case, native oxide layer 116 may be formed on and/or over an uppermost surface of gate electrode 108. Similarly, a native oxide layer may be formed on and/or over an uppermost surface of source/drain region 114.

As illustrated in FIG. 2B, native oxide layer 116 and other impurities, which may be formed on and/or over the upper surfaces of gate electrode 108 and source/drain region 114, are removed via a pre-cleaning process. In accordance with embodiments, diluted Hydrofluoric (HF) acid, e.g., a solution of deionized water and HF at a ratio of 200:1 is used as a cleaning solution.

As illustrated in FIGS. 2C and 3, silicide metal layer 118 is formed on and/or over the entire surface of semiconductor substrate 100 by depositing a metal layer such as, e.g., cobalt (Co). Because cobalt (Co) that may be used in silicide metal layer 118 is easily oxidized upon exposure to air, capping layers 120, 122 may be formed on and/or over silicide metal layer 118 by sequentially depositing metal layers composed of, e.g., titanium (Ti) and titanium nitride (TiN) (S201). After formation of silicide metal layer 118, an annealing process is carried out to react silicon (Si) of semiconductor substrate 100 with cobalt (Co) of silicide metal layer 118. An excessive delay may occur prior to carrying out the annealing process. For example, a standby time (delay) of a manufacturing line may take approximately three hours due to an unexpected facility failure or a holding time in a previous process. Such an excessive delay causes an oxidation reaction at an interface of semiconductor substrate 100 in contact with silicide metal layer 118. The growth of a native oxide layer due to the oxidation reaction causes liquid marks and deteriorates a reaction of silicon (Si) and cobalt (Co) during the following annealing process, resulting in silicide defects.

Accordingly, in accordance with embodiments, if a predetermined time lapses or passes after forming silicide metal layer 118 but prior to carrying out an annealing process for the formation of silicide layers, a process for removing silicide metal layer 118 formed in the previous process is carried out rather than immediately carrying out the annealing process.

As illustrated in example FIGS. 2D and 3, if a predetermined time period passes after forming silicide metal layer 118 and prior to carrying out an annealing process for the formation of silicide layers (S203), silicide metal layer 118 is removed using cleaning and etching chemicals. In this case, a mixture of sulfuric acid ($H_2SO_4$) and hydrogen peroxide ($H_2O_2$) as a cleaning chemical and a mixture of tetra methylammonium hydroxide (TMH), hydrogen peroxide ($H_2O_2$) and deionized water as an etching chemical are used simultaneously. The reason for using an etching chemical compound and a cleaning chemical compound simultaneously is that deposition of silicide metal layer 118 may cause a slight reaction of cobalt (Co) and silicon (Si) and in this case, it is extremely difficult to clearly remove silicide metal layer 118 using only the cleaning chemical compound. For example, the cleaning chemical is prepared by mixing sulfuric acid ($H_2SO_4$) and hydrogen peroxide ($H_2O_2$) at a ratio of 1:2 and is used at a temperature range of between 120° C. to 130° C. The etching chemical is prepared by mixing TMH, hydrogen peroxide ($H_2O_2$) and deionized water at a ratio of 1:2.3:36.7 and is used at a temperature range of between 70° C. to 75° C. (S205).

A native oxide layer and other impurities, which may be formed on and/or over the uppermost surfaces of gate electrode 108 and source/drain region 114, are removed by performing a pre-cleaning process, prior to repeatedly forming a silicide metal layer. Diluted hydrofluoric (HF) acid, e.g., a solution of deionized water and HF at a ratio of 200:1 is used as a cleaning solution (S207).

As illustrated in example FIGS. 2E and 3, silicide metal layer 124 is repeatedly formed on and/or over the entire surface of semiconductor substrate 100 by depositing a metal such as cobalt (Co). Because cobalt (Co) used in silicide metal layer 124 is easily oxidized upon its exposure to air, capping layers 126, 128 may be formed on and/or over silicide metal layer 124 by sequentially depositing a metal such as one of titanium (Ti) and titanium nitride (TiN) (S209).

As illustrated in example FIGS. 2F and 3, a primary annealing process may then be conducted in order to react silicon (Si) of semiconductor substrate 100 with cobalt (Co) of silicide metal layer 124, thus forming silicide layers 130 of cobalt monosilicide (CoSi) on and/or over the uppermost surfaces of gate electrode 108 and source/drain region 114 respectively (S211).

Referring to example FIGS. 2G and 3, the portion of semiconductor substrate 100 on and/or over which the silicide layers 130 are formed, is subjected to a cleaning process using a cleaning solution, such as, e.g., a sulfuric acid solution, to remove portions of silicide metal layer 124 and capping layers 126, 128 which having not reacted during the primary annealing process, i.e. cobalt (Co)/titanium (Ti)/titanium nitride (TiN) residues on and/or over substrate 100 (S213). Thereafter, a secondary annealing process is carried out to convert cobalt monosilicide (CoSi) of silicide layers 130 into cobalt disilicide ($CoSi_2$) having a lower surface resistance (S215).

As apparent from the above description, embodiments provide a method for forming silicide in a semiconductor device such that if an excessive delay passes after forming a silicide metal layer and prior to carrying out an annealing process, the silicide metal layer is removed to remove a native oxide layer formed on and/or over a surface of a semiconductor substrate and thereafter, a silicide forming process is repeatedly carried out. This may prevent the occurrence of liquid marks due to an oxidation reaction at an interface of the semiconductor substrate in contact with the silicide metal layer, thereby preventing silicide defects due to the excessive delay.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for forming silicide in a semiconductor device comprising:
    forming a first silicide metal layer over a semiconductor substrate in which a gate electrode, device isolation layer, and source/drain region are formed; and then
    removing the first silicide metal layer using a cleaning chemical compound and an etching chemical compound if a predetermined period of time lapses after forming the first silicide metal layer; and then
    removing a native oxide layer formed over an uppermost surface of the gate electrode by performing a pre-cleaning process on the semiconductor substrate after removing the first silicide metal layer; and then
    repeatedly forming a second silicide metal layer over the semiconductor substrate after removing the native oxide layer; and then
    forming a silicide layer by performing an annealing process on the semiconductor substrate after forming the second silicide metal layer is repeatedly formed.

2. The method of claim 1, wherein the cleaning chemical compound comprises a mixture of sulfuric acid ($H_2SO_4$) and hydrogen peroxide ($H_2O_2$).

3. The method of claim 2, wherein the cleaning chemical compound is used at a temperature range of between 120° C. to 130° C.

4. The method of claim 1, wherein the etching chemical compound comprises a mixture of tetra methylammonium hydroxide (TMH), hydrogen peroxide ($H_2O_2$) and deionized water.

5. The method of claim 4, wherein the etching chemical compound is used at a temperature range of between 70° C. to 75° C.

6. The method of claim 1, wherein the cleaning chemical compound comprises a mixture of sulfuric acid ($H_2SO_4$) and hydrogen peroxide ($H_2O_2$) and the etching chemical compound comprises a mixture of tetra methylammonium hydroxide (TMH), hydrogen peroxide ($H_2O_2$) and deionized water.

7. The method of claim 6, wherein the cleaning chemical compound is used at a temperature range of between 120° C. to 130° C. and the etching chemical compound is used at a temperature range of between 70° C. to 75° C.

8. The method of claim 1, further comprising, before forming the first silicide metal layer:
    removing a native oxide layer formed over the uppermost surface of the gate electrode by performing a pre-cleaning process on the semiconductor substrate.

9. The method of claim 8, wherein a cleaning solution used in the pre-cleaning process comprises diluted hydrofluoric (HF) acid.

10. The method of claim 1, further comprising, after forming the first silicide metal layer and before removing the first silicide metal layer:
    forming capping layers over the first silicide metal layer by sequentially depositing a first metal layer and a second metal layer.

11. The method of claim 10, wherein the first metal layer comprises titanium (Ti) and the second metal layer comprises titanium nitride (TiN).

12. The method of claim 10, further comprising, after forming the capping layers:
    removing residues of the first silicide metal layer and the capping layers; and then
    performing a secondary annealing process on the semiconductor substrate.

13. The method of claim 12, wherein the secondary annealing process converts the silicide layer into a cobalt disilicide ($CoSi_2$) layer having a lower surface resistance.

14. The method of claim 1, wherein the first and second silicide layers are formed over the uppermost surfaces of the gate electrode and the source/drain region.

15. The method of claim 1, wherein the first and second silicide layers comprises cobalt monosilicide (CoSi).

16. A method comprising:
   forming a gate electrode, device isolation layer, and source/drain region over a semiconductor substrate; and then
   forming a first silicide metal layer over the uppermost surface of the gate electrode and the source/drain region are formed; and then
   simultaneously performing a first cleaning process and an etching process to remove the first silicide metal layer if a predetermined period of time lapses after forming the first silicide metal layer; and then
   performing second cleaning process on the semiconductor substrate after removing the first silicide metal layer to remove a native oxide layer formed over an uppermost surface of the gate electrode; and then
   repeatedly forming a second silicide metal layer over the semiconductor substrate after performing the second cleaning process; and then
   forming a silicide layer by performing an annealing process on the semiconductor substrate after repeatedly forming the second silicide metal layer.

17. The method of claim 16, wherein a cleaning chemical compound used for performing the first cleaning process comprises a mixture of sulfuric acid ($H_2SO_4$) and hydrogen peroxide ($H_2O_2$), an etching chemical compound for performing the etching process comprises a mixture of tetra methylammonium hydroxide (TMH), hydrogen peroxide ($H_2O_2$) and deionized water and a cleaning chemical compound for performing the second cleaning process comprises diluted hydrofluoric (HF) acid.

18. A method comprising:
   forming device isolation layer in a semiconductor substrate to define an active area; and then
   forming a gate electrode in the active area; and then
   performing a low density ion implantation process using the gate electrode as an ion implantation mask to form a lightly doped drain region in the semiconductor substrate between the gate electrode and the device isolation layer; and then
   forming a spacer over a sidewall of the gate electrode after forming the lightly doped drain region; and then
   performing a high density ion implantation process using the spacer and the gate electrode as ion implantation masks to form a source/drain region in the semiconductor substrate between the spacer and the device isolation layer; and then
   performing a first cleaning process on the semiconductor substrate; and then
   forming a first silicide metal layer over the uppermost surface of the gate electrode and the source/drain region are formed; and then
   simultaneously performing a second cleaning process and an etching process to remove the first silicide metal layer if a predetermined period of time lapses after forming the first silicide metal layer; and then
   repeatedly forming a second silicide metal layer over the semiconductor substrate after simultaneously performing the second cleaning process and the etching process; and then
   forming a silicide layer by performing an annealing process on the semiconductor substrate after repeatedly forming the second silicide metal layer.

19. The method of claim 18, wherein a first cleaning chemical compound for performing the first cleaning process comprises diluted hydrofluoric (HF) acid, a second cleaning chemical compound for performing the second cleaning process comprises a mixture of sulfuric acid ($H_2SO_4$) and hydrogen peroxide ($H_2O_2$) and an etching chemical compound for performing the etching process comprises a mixture of tetra methylammonium hydroxide (TMH), hydrogen peroxide ($H_2O_2$) and deionized water.

20. The method of claim 19, wherein the second cleaning chemical compound is used at a temperature range of between 120° C. to 130° C. and the etching chemical compound is used at a temperature range of between 70° C. to 75° C.

* * * * *